United States Patent [19]

Kobayashi et al.

[11] Patent Number: 4,977,443

[45] Date of Patent: Dec. 11, 1990

[54] SEMICONDUCTOR MODULE AND AN ELECTRONIC COMPUTER USING THE SEMICONDUCTOR MODULE

[75] Inventors: Shiro Kobayashi, Hitachi; Masahiko Itoh, Hitachiota; Masakiyo Izumiya, Mito, all of Japan

[73] Assignee: Hitachi, Ltd., Tokyo, Japan

[21] Appl. No.: 409,139

[22] Filed: Sep. 19, 1989

[30] Foreign Application Priority Data

Sep. 21, 1988 [JP] Japan .................................. 63-234986

[51] Int. Cl.⁵ ........................ H01L 23/44; H01L 23/36
[52] U.S. Cl. ..................................... 357/82; 165/80.5; 165/134.1
[58] Field of Search ...................... 357/82, 81; 361/385, 361/386; 165/62, 63, 70, 75, 80.4, 80.5, 134.1; 62/4, 6; 174/15.1, 15.2, 16.3

[56] References Cited

U.S. PATENT DOCUMENTS

| | | | |
|---|---|---|---|
| 3,947,610 | 3/1976 | Bodmer et al. | 427/437 |
| 4,487,707 | 12/1984 | Hokzknecht | 252/68 |
| 4,698,728 | 10/1987 | Tustaniwskyj et al. | 361/385 |

FOREIGN PATENT DOCUMENTS

| | | |
|---|---|---|
| 0178729 | 4/1986 | European Pat. Appl. . |
| 0246657 | 11/1987 | European Pat. Appl. . |
| 0273720 | 7/1988 | European Pat. Appl. . |
| 0279157 | 12/1986 | Japan ................................. 357/82 |
| 0304652 | 12/1988 | Japan ................................. 357/82 |

OTHER PUBLICATIONS

Metals Handbook-Ninth Edition-vol. 13, "Corrosion", ASM International-pp. 754–769.
"Protection System for a Liquid Cooled Computer System Using a Shell and Tube Heat Exchanger"-IBM Technical Disclosure Bulletin-vol. 25, No. 7B, Dec. 1982, pp. 3909–3910.

*Primary Examiner*—Rolf Hille
*Assistant Examiner*—S. V. Clark
*Attorney, Agent, or Firm*—Antonelli, Terry, Stout & Kraus

[57] ABSTRACT

A semiconductor module comprises semiconductor elements, cooling structures for cooling the semiconductor elements by liquid refrigerant, and a housing for accommodating the semiconductor elements and the cooling structures, wherein within the housing, there is supplied or enclosed sealingly a reactive gas which reacts with ions of a metal constituting the cooling structures to form a chemical compound hard to dissolve to the refrigerant but does not react with the metal itself constituting the cooling structures.

11 Claims, 4 Drawing Sheets

SEMICONDUCTOR MODULE AND AN ELECTRONIC COMPUTER USING THE SEMICONDUCTOR MODULE

BACKGROUND OF THE INVENTION

This invention relates to a semiconductor module having a water-cooling system for semiconductor elements such as IC chips and LSI chips and an electronic computer using this semiconductor module.

Semiconductor modules in which semiconductor elements such as IC chips and LSI chips are mounted need to be cooled to prevent their temperature rising on account of the heat generation of the elements. The conventional cooling method is to provide packages containing the elements with fins and forcedly cool the packages by exposing them to a current of air set up by a fan. However, with the progressive increase in the degree of integration of semiconductor elements, the amount of heat generated has increased to such an extent that it is difficult to cool the elements sufficiently by air cooling. Therefore, it has been proposed to use a water-cooling method which offers high cooling efficiency instead of the air-cooling method. Among the water-cooling methods, a method in which a cooling structure is mounted on a semiconductor element and water is introduced therethrough to cool the semiconductor element is the most practical method with high cooling efficiency.

The water-cooling structure that has been proposed uses bellows or a diaphragm to absorb thermal deformation resulting from heat generation of the semiconductor elements and is constructed such that the cooling water is introduced through the inside thereof. The diaphragm or bellows are formed of a thin sheet of metal. Water-cooling structures or semiconductor modules have been proposed which were designed with consideration given to the detection of corrosion of the metal sheet by cooling water or the detection of water leakage attributable to the progress of corrosion. Japanese Patent Unexamined Publication No. 61-276242 proposes a semiconductor element cooling apparatus in which a moisture sensor to detect water leakage is provided in a housing containing water-cooling structures. Japanese Patent Unexamined Publication No. 61-67844 discloses a semiconductor element cooling apparatus constructed in a dual structure such that the bellows are not exposed to the water. Japanese Patent Unexamined Publication No. 62-194699 also reveals a semiconductor element cooling apparatus having a function to detect a wall-thickness loss of the diaphragm or bellows attributable to the corrosion.

The prior arts described above were made with consideration given to the provision of a function to detect corrosion or water leakage in the water-cooling structures, but no consideration was given to the prevention of water leakage due to the progress of corrosion of the cooling structures. More specifically, consideration was not given to the prevention of leakage of cooling water by quickly detecting and repairing a pinhole which is made in the cooling structures by the progress of corrosion.

SUMMARY OF THE INVENTION

An object of the present invention is to provide a semiconductor module which solves the problems of the aforementioned prior arts and which has a function to prevent a continuous leakage of cooling water through a pinhole which is made in the cooling structures by corrosion and also provide an electronic computer having such a function.

Another object of the present invention is to provide an electronic computer which is capable of preventing a semiconductor module from being destroyed by cooling water leaking thereinto through a pinhole made in the cooling structures by corrosion.

An embodiment of the semiconductor module according to the invention comprises semiconductor elements, cooling structures for cooling the semiconductor elements by liquid refrigerant, and a housing for accommodating the semiconductor elements and the cooling structures, wherein within the housing, there is supplied or enclosed sealingly a reactive gas which reacts with ions of a metal constituting the cooling structures to form a chemical compound hard to dissolve to the refrigerant, but does not react with the metal itself constituting the cooling structures.

Preferably the reactive gas chiefly includes oxygen or carbon dioxide.

The gas is supplied or enclosed sealingly at a pressure higher than the pressure of the refrigerant.

Another embodiment of the semiconductor module according to the present invention comprises semiconductor elements, cooling structures for cooling the semiconductor elements by liquid refrigerant, wherein there is injected in the refrigerant a reactive gas, which reacts with ions of a metal constituting the cooling structures to form a chemical compound hard to dissolve to the refrigerant, but does not react with the metal itself constituting the cooling structures.

A still another embodiment of the semiconductor module according to the present invention comprises semiconductor elements, cooling structures for cooling the semiconductor elements by liquid refrigerant, and a housing for accommodating the semiconductor elements and the cooling structures, wherein the cooling structures are coated on a surface thereof exposed to the refrigerant with a metal which reacts with a reactive gas to form a chemical compound hard to dissolve to the refrigerant and the reactive gas is injected in either the refrigerant or the housing. The metal mentioned above is aluminum or zinc.

Another embodiment of the semiconductor module according to the present invention comprises semiconductor elements, cooling structures for cooling the semiconductor elements by liquid refrigerant and a housing for accommodating the semiconductor elements and the cooling structures, wherein a reactive gas is injected in either the liquid refrigerant or the housing and wherein metal ions which react with the reactive gas to form a chemical compound hard to dissolve to the liquid refrigerant are injected in the liquid refrigerant.

The metal ions mentioned above comprise at least one of calcium, cobalt, magnesium, nickel, iron, lead and zinc ions.

A yet another embodiment of the semiconductor module according to the present invention comprises semiconductor elements and cooling structures for cooling the semiconductor elements by liquid refrigerant, wherein fine solid substances which are hard to dissolve to the refrigerant and can move with the movement of the refrigerant are contained in the liquid refrigerant, whereby a pinhole formed by corrosion in the cooling structures is clogged by the solid substances.

An embodiment of the electronic computer according to the present invention comprises a plurality of semiconductor modules, each including semiconductor elements, cooling structures for cooling the semiconductor elements by liquid refrigerant, and a housing for accommodating the semiconductor elements and the cooling structures, a heat exchanger for cooling the liquid refrigerant; a circulating pump for forcedly circulating the liquid refrigerant; a purifying unit for purifying the liquid refrigerant; gas supply means for supplying into the refrigerant a reactive gas which reacts with ions of a metal constituting the cooling structures to form a chemical compound hard to dissolve to the liquid refrigerant; reactive gas detecting means for measuring a gas concentration in the liquid refrigerant; and control means for controlling, on the basis of measurement results by the reactive gas detecting means, the gas supply means to keep the reactive gas concentration in the refrigerant at a constant level.

Another embodiment of the electronic computer according to the present invention comprises a plurality of semiconductor modules, each including semiconductor elements, cooling structures for cooling the semiconductor elements by a liquid refrigerant, and a housing for accommodating the semiconductor elements and the cooling structures; a heat exchanger for cooling the liquid refrigerant; a circulating pump for forcedly circulating the liquid refrigerant; a purifying unit for purifying the liquid refrigerant; gas supply means for supplying into the housing a reactive gas which reacts with ions of a metal constituting the cooling structures to form a chemical compound hard to dissolve to the liquid refrigerant; gas detecting means for detecting the occurrence of a pinhole in each of the semiconductor modules; notifying means for notifying, on the basis of detection results by the gas detecting means, a semiconductor module in which a pinhole occurred; gas pressure measuring means for measuring the pressure of the reactive gas in the housing; and control means for controlling, on the basis of measurement results by the gas pressure measuring means, the gas supply means to keep the gas pressure in the housing higher by a predetermined value than the pressure of the cooling water.

According to the invention, a corroded part caused by the cooling water, which occurs in semiconductor modules having water-cooling structures, can be repaired quickly by itself to stop the leakage of the liquid refrigerant at a short time period and therefore trouble can be prevented from developing in the semiconductor modules and the electronic computer.

DESCRIPTION OF THE PREFERRED EMBODIMENTS

Figure 1:
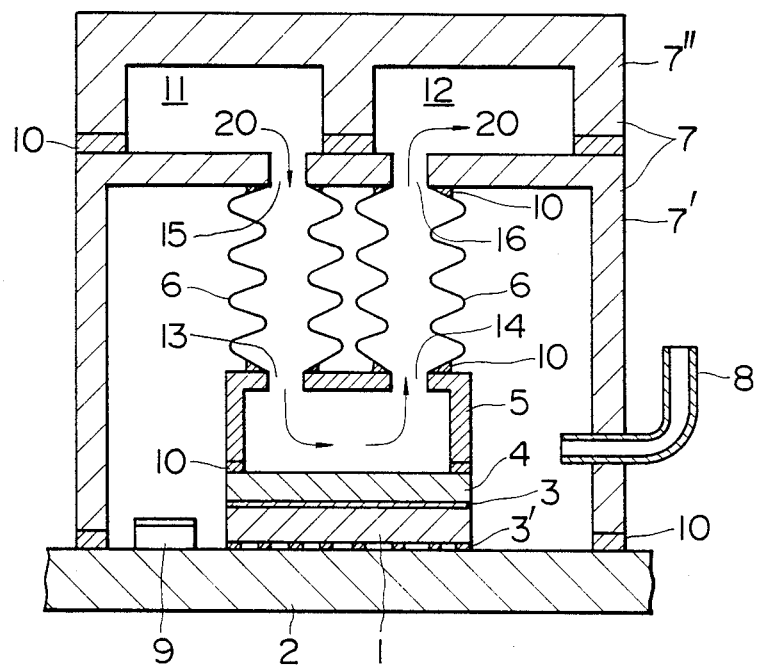
FIGS. 1 to 4 are schematic sectional views of semiconductor modules according to the invention.

A first embodiment of a semiconductor module according to the invention will be described with reference to FIG. 1.

A semiconductor element 1 is bonded to a multi-layer substrate 2 by solder balls 3'. The semiconductor element 1 has a cooling plate 4 fixed to an upper surface thereof by use of a heat-conductive paste 3. A cap 5 allowing cooling water 20 to pass therethrough is fixed by solder 10 to an upper surface of the cooling plate 4. The cap 5 has two openings 13, 14 formed at an upper surface thereof. The lower ends of bellows 6 are glued to the upper surface of the cap 5 so as to enclose the openings 13, 14. The upper ends of the bellows 6 are glued such that they enclose respectively an inlet 15 and an outlet 16 of the cooling water 20, formed in an upper surface of a lower housing 7'. The bellows are made of nickel, titanium or stainless steel. The lower housing 7' is glued to the multi-layer substrate 2 and thereby accommodates the semiconductor element 1 and the bellows 6. The lower housing 7' is provided with a gas supply port 8. A reactive gas, for example a helium gas including oxygen gas or carbon dioxide, which does not react with a metal itself constituting the bellows 6 but reacts with ions of the metal to form a chemical compound hard to dissolve to cooling water, is supplied from a gas supply source, not shown, into the lower housing 7'. An upper housing 7" having cooling water passages 11, 12 provided therein is gluded to the upper surface of the lower housing 7' and the cooling water passages are connected to a cooling water supply source, not shown. Consequently, as indicated by the arrows, cooling water flows through the cooling water passage 11, the bellows 6, the cap 5, the bellows 6, and the cooling water passage 12 and takes the heat of the semiconductor element 1 from the cooling plate 4, thus cooling the semiconductor element 1. A gas pressure detector 9 is provided on the multi-layer substrate 2 in the housing and the gas pressure in the housing is kept higher than the pressure of the cooling water.

Therefore, if a pinhole occurs in the bellows 6 caused by corrosion, the reactive gas in the lower housing 7', being pressurized higher than the cooling water 20, flows through the pinhole into the bellows 6. At this time, since the metal constituting the bellows 6 has been ionized by the corrosion, the reactive gas reacts with the metal ions, thereby forming a chemical compound hard to dissolve to the cooling water. This chemical compound blocks up the pinhole and leakage of the cooling water into the housing is thus prevented.

In the embodiment described above, the reactive gas is supplied into the housing, but the reactive gas may be pressurized and sealingly enclosed in the housing.

As a modification of the above embodiment, it is possible to inject calcium ions, iron ions, zinc ions, etc. into the cooling water. In this case, the injected metal ions as well as the corrosion-induced ions of the metal constituting the bellows react with the reactive gas, facilitating the formation of a hard-to-dissolve chemical compound and therefore realizing a quicker blocking of the pinhole.

Figure 2:
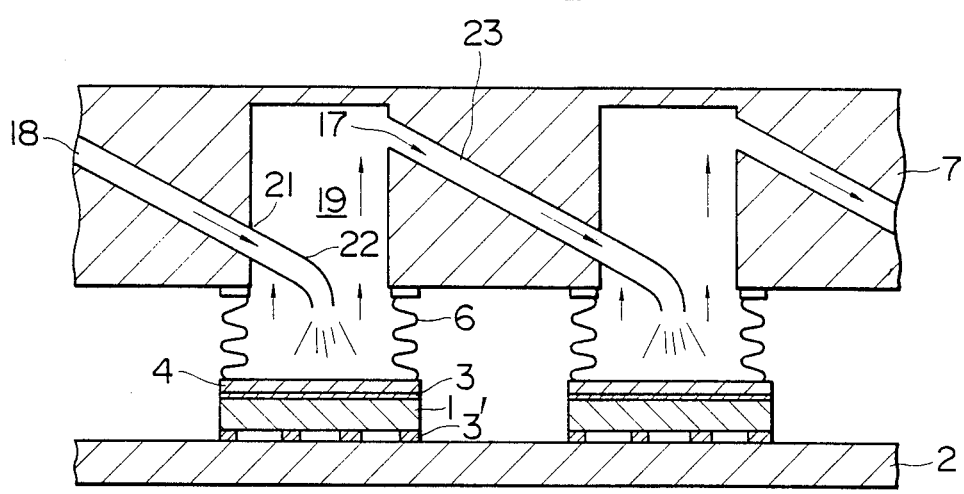

A second embodiment of the semiconductor module according to the present invention will be described with reference to FIG. 2.

Semiconductor elements 1 are bonded to a multi-layer substrate 2 with solder balls 3'. A cooling plate 4 is fixed by a heat-conductive paste 3 to an upper surface of the semiconductor element 1. A lower end of a bellows 6 is glued to an upper surface of the cooling plate 4. An upper end of the bellows 6 is glued to the housing in such a manner as to enclose a cooling water reservoir 19. The bellows 6 are made of nickel, titanium or stainless steel. In the housing 7, there are formed a passage 18 of the cooling water 20 and the cooling water reservoir 19 described above. A guide pipe 22 is connected to an opening 21 of the passage 18 which is opened to the cooling water reservoir 19. The extremity of the guide pipe 22 is located generally in the middle and above the cooling plate 4. A cooling water outlet 17 is provided at a high position of the cooling water reservoir 19 and connected to a subsequent passage 23. In consequence, the cooling water 20 passes the passage 18 and flows into the bellows 6, and after cooling the semiconductor element 1, the cooling water 20 flows out of the outlet 17. In the second embodiment, the cap 5 used in the first embodiment has been omitted and the bellows have been reduced to one. In the cooling water 20, there is injected a reactive gas, for example oxygen gas or carbon dioxide, which does not react with a metal itself constituting the bellows but reacts with ions of the metal, thus forming a chemical compound hard to dissolve to the cooling water, said reactive gas being supplied from a gas supply source, not shown.

When a corroded part occurs in the bellows 6, the metal constituting the bellows 6 has been ionized by corrosion at the corroded part. Therefore, the reactive gas reacts with the metal ions, thus forming a chemical compound hard to dissolve to the cooling water. This chemical compound adheres to the corroded part, obstructing the progress of corrsion and thus preventing the cooling water from leaking into the housing.

In the second embodiment, as in the first embodiment, it is possible to inject calcium ions, iron ions, zinc ions, etc. in the cooling water. In this case, both the injected metal ions and the corrosion-induced ions of the metal constituting the bellows react with the reactive gas, thereby quickly forming a hard-to-dissolve chemical compound, with the results that the repair of the corroded part is facilitated.

As described, in the modification of the second embodiment, metal ions are injected into the cooling water. Instead of the metal ions, it is possible to inject fine solid substances which are hard to dissolve to the cooling water and which can move with the movement of the cooling water. In this case, when a pinhole occurs in the bellows caused by corrosion, the solid substances clog the pinhole as the cooling water leaks into the housing and the pinhole is eventually closed.

Figure 3:
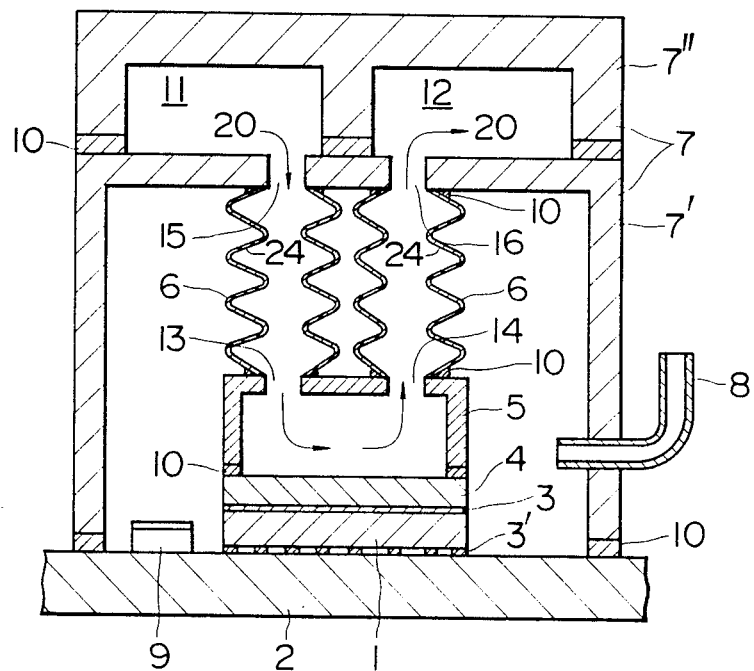

A third embodiment of the semiconductor module according to this invention will be described with reference to FIG. 3.

In the third embodiment, there is further formed a coating layer 24 of aluminum or zinc on the internal surface of the bellows 6 of the first embodiment. The structure of the other factors of the third embodiment is the same as that of the first embodiment. Aluminum or zinc is freely soluble in the cooling water and it naturally follows that there are always aluminum ions or zinc ions in the cooling water. When a pinhole is produced in the bellows 6 resulted from corrosion thereof, the reactive gas in the housing 7 flows through the pinhole into the bellows 6. At this time, the metal constituting the bellows 6 has been ionized by corrosion and there exist aluminum ions or zinc ions in the cooling water. Consequently, the reactive gas react with these metal ions, thereby forming a chemical compound which is hard to dissolve to the cooling water. The chemical compound clogs the pinhole and the leakage of the cooling water into the housing can be prevented. In the third embodiment, the cooling water always contains metal ions that react with the reactive gas, and therefore a chemical compound is formed faster than in the first embodiment. As a result, the pinhole is closed quickly.

Figure 4:
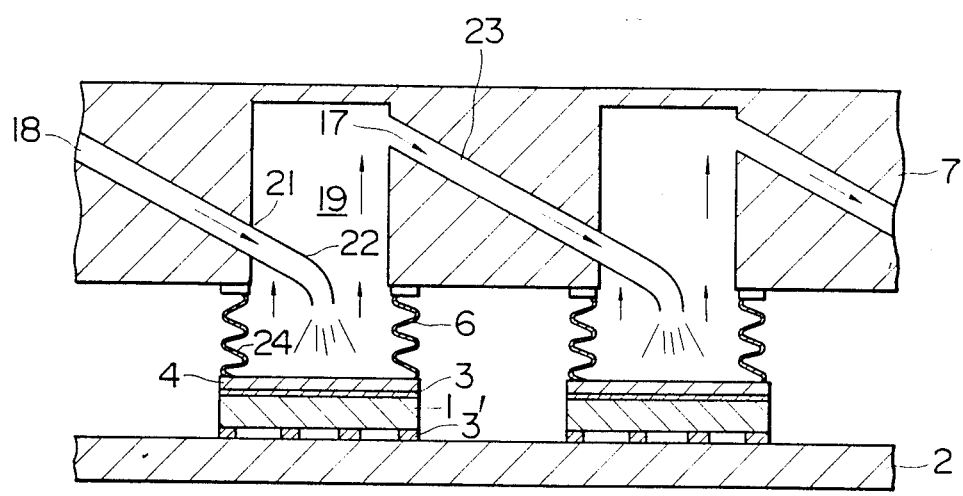

Referring to FIG. 4, description will now be made of a fourth embodiment of the semiconductor module according to the present invention.

In the fourth embodiment, there is additionally formed a coating layer 24 of aluminum or zinc on the internal surface of the bellows 6 of the second embodiment. The structure of the other factors of the four embodiment is the same as in the second embodiment. Since aluminum or zinc is freely soluble in the cooling water, aluminum ions or zinc ions are always present in the cooling water. The ions react with a reactive gas included in the cooling water, thereby forming a chemical compound which adheres to the internal surface of the bellows 6 and therefore inhibiting the corrosion of the bellows 6. If corrosion occurs, both the metal ions at the corroded part and the ions of the coating layer 24 react with the reactive gas simultaneously. This accelerated reaction process serves to quickly repair the corroded part, thus preventing the cooling water from leaking into the housing.

An embodiment of an electronic computer according to the invention will next be described with reference to FIGS. 5 and 6.

Figure 5:
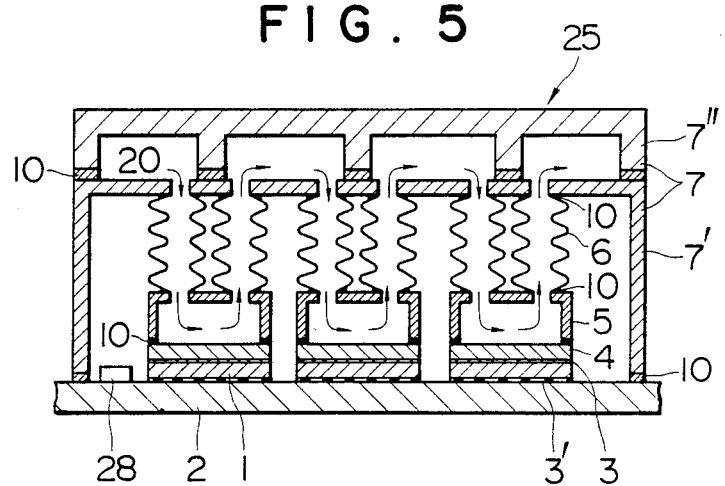
FIGS. 5 and 6 are a schematic sectional view of a semiconductor module and a schematic diagram of a cooling system, respectively, both used in an embodiment of a computer according to the invention.
Figure 6:
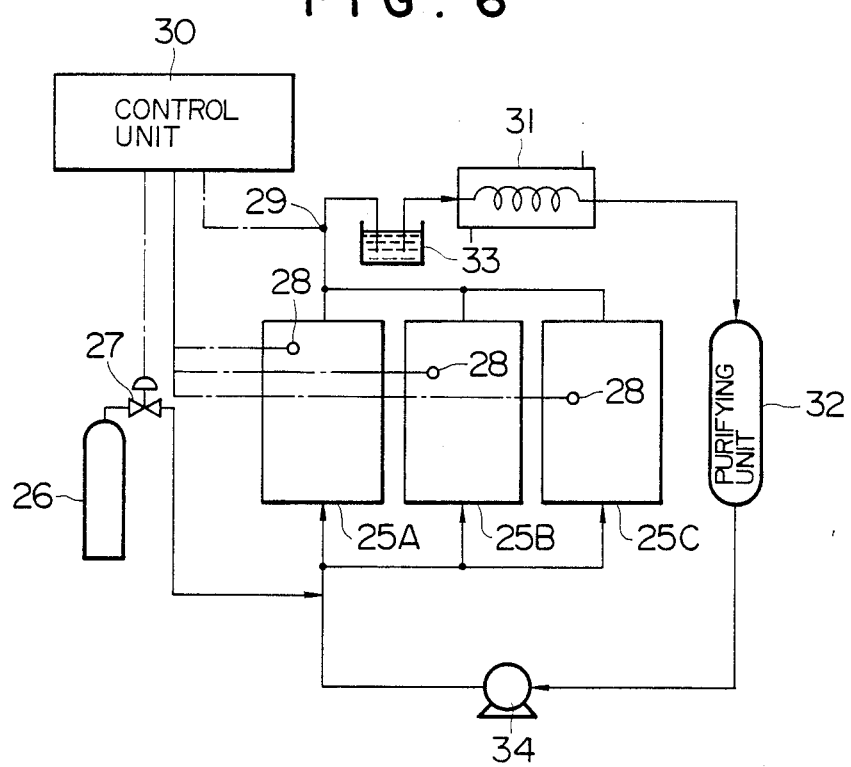

FIG. 5 is a schematic sectional view of a semiconductor module 25 used in this embodiment. This semiconductor module 25 basically resembles to the one shown in FIG. 1. The difference lies in a change made in the semiconductor module of FIG. 1 to a type where in a reactive gas is injected into the cooling water. In the housing 76, the cooling water passage is formed in such a way that the cooling water 20 flows as it cools the adjoining semiconductor elements 1 one after another. As shown in FIG. 6, the semiconductor module is connected to a circulating cooling water system. The circulating cooling water system comprises a cooling water tank 33 for containing the cooling water, a heat exchanger 31 for cooling the cooling water 20 by heat exchange with another medium, a pump 34 for circulating the cooling water, and a cooling water purifying unit 32 for removing impurities from the cooling water. The circulating cooling water system is connected with a gas cylinder 26 containing a reactive gas and a detecting electrode 29 for detecting the concentration of the reactive gas in the cooling water. According to signals from the detecting electrode 29, a control unit 30 controls an electromagnetic valve 27 to keep the reactive gas concentration in the cooling water at an adequate value. In the lower housing 7' of each of the semiconductor modules 25, there is provided a gas detector 28 connected to the control unit 30.

The cooling water is cooled by the heat exchanger 31, deprived of impurities by the purifying unit 32, passed through the semiconductor modules 25, takes heat from the semiconductor elements 1 and is returned to the cooling water tank 33. When the bellows suffers from corrosion, the bellows' constituent metal has been ionized at the corroded part. Therefore, the reactive gas included in the cooling water reacts with the metal ions, thus forming a chemical compound hard to dissolve to the cooling water. This chemical compound adheres to the corroded part, inhibiting the progress of corrosion. In this way, the cooling water is prevented from leaking into the housing. If, for some reason, a pinhole is formed in the bellows of a semiconductor module, the semiconductor module 25A for example, and cooling water leaked into the housing, the reactive gas also flows into the housing. As a result, the gas detector 28 detects the reactive gas and transmits a signal to the control unit 30. The control unit 30 sends a warning that cooling water leaked into the semiconductor module 25A. In response to this warning, the operation of the semiconductor module 25 is stopped and it is replaced before any accident takes place. Or otherwise, a switchover is made to a spare semiconductor module, a semiconductor module 25B for example, and the semiconductor module 25A in which a leakage of cooling water occurred is repaired completely.

In this embodiment, the semiconductor module is arranged such that a pinhole is prevented from occurring in the bellows, but if a pinhole should occur, the pinhole can be repaired before it leads to a failure of the computer.

Another embodiment of a computer according to the invention will now be described with reference to FIGS. 7 and 8.

Figure 7:
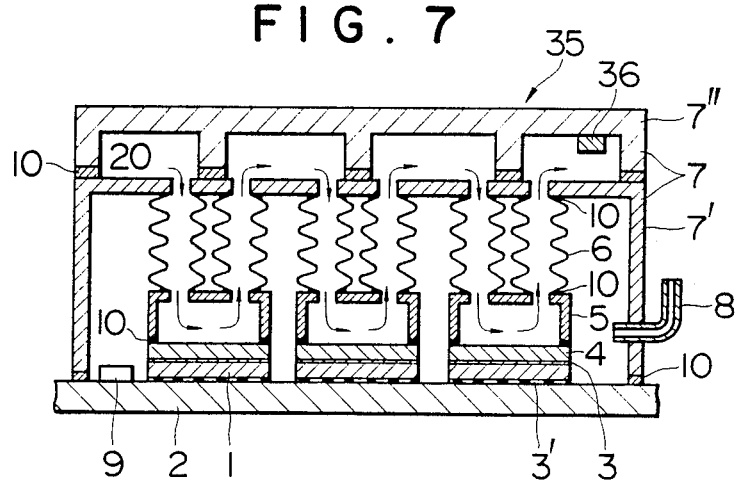
FIGS. 7 and 8 are a schematic sectional view of a semiconductor module and a schematic diagram of a cooling system, respectively, both used in another embodiment of a computer according the invention.
Figure 8:
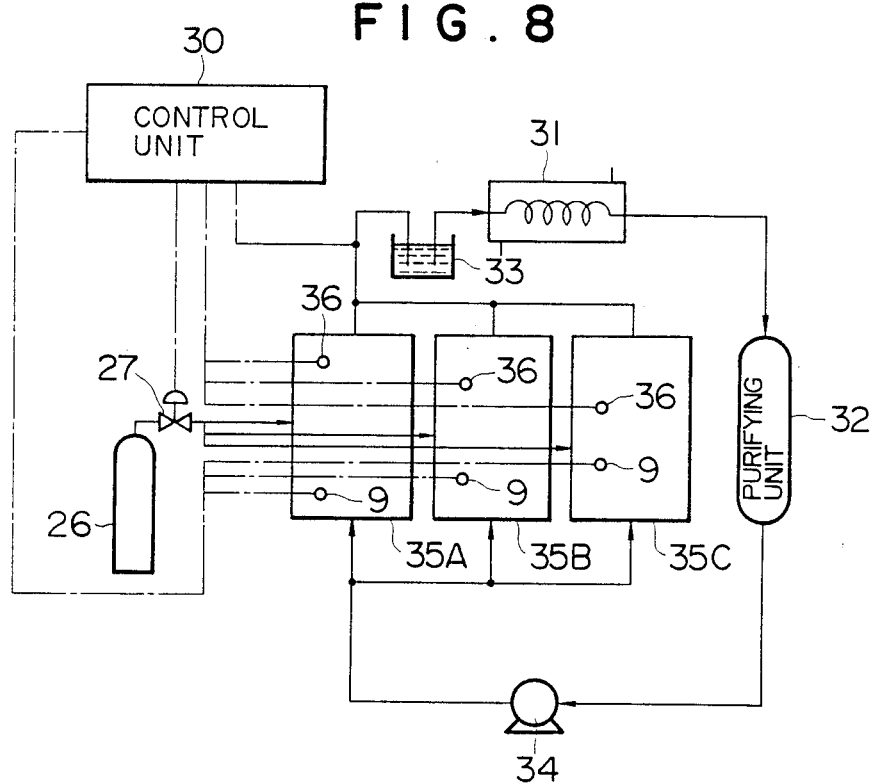

FIG. 7 is a schematic sectional view of a semiconductor module 35 used in this embodiment. The semiconductor module 35 is basically the same as the semiconductor module of FIG. 1. Some points in which this embodiment differs from the preceding embodiment are as follows. In each of the semiconductor modules 35A, 35B and 35C, a gas pressure detector 9 is provided in the housing and a gas detector 36 is installed in the cooling water passage. On the basis of measurement results of the gas pressure detector 9, the control unit 30 controls the electromagnetic valve 27 to keep the gas pressure in the housing higher than the pressure of the cooling water. The operation of closing a pinhole caused by corrosion is the same as in the semiconductor module shown in FIG. 1 and its description is not repeated. If a pinhole is formed by corrosion in the bellows of a semiconductor module, the semiconductor module 35A for example, the gas detector 36 detects a reactive gas that flowed into the cooling water and sends a signal to the control unit 30. The control unit 30 issues a warning that a pinhole was made in the semiconductor module 35A and the cooling water was leaked. In response to this warning, the operation of the semiconductor module 35A is stopped and it is replaced before a failure results. Or otherwise, a switchover is made to a spare semiconductor module, the semiconductor module 35B for example, and the semiconductor module 35A in which the cooling water leaked is repaired completely.

In this embodiment, if a pinhole occurs, it can be repaired before it leads to a failure of the computer.

What is claimed is:

1. A semiconductor module comprising semiconductor elements, cooling structures for cooling said semiconductor elements by liquid refrigerant, and a housing for accommodating said semiconductor elements and said cooling structures, wherein within said housing, there is supplied or enclosed sealingly a reactive gas which reacts with ions of a metal constituting said cooling structures to form a chemical compound hard to dissolve to the liquid refrigerant but does not react with the metal itself constituting said cooling structure.

2. The semiconductor module according to claim 1, wherein the reactive gas includes one of oxygen gas and carbon dioxide gas.

3. The semiconductor module according to claim 1, wherein the reactive gas is supplied or enclosed sealingly, at a pressure higher than the pressure of the refrigerant.

4. A semiconductor module comprising semiconductor elements, and cooling structures for cooling said semiconductor elements by liquid refrigerant, wherein a reactive gas which reacts with ions of a metal constituting said cooling structures to form a chemical compound hard to dissolve to the refrigerant but does not react with the metal itself constituting said cooling structure is injected in said liquid refrigerant.

5. A semiconductor module comprising semiconductor elements, cooling structures for cooling said semiconductor elements by liquid refrigerant, and a housing for accommodating said semiconductor elements and said cooling structures, wherein a metal which reacts with a reactive gas to form a chemical compound hard to dissolve to the liquid refrigerant is coated on a surface of said cooling structures exposed to the liquid refrigerant, and wherein the reactive gas is injected in one of the liquid refrigerant and said housing.

6. The semiconductor module according to claim 5, wherein said metal is one of aluminum and zinc.

7. A semiconductor module comprising semiconductor elements, cooling structures for cooling said semiconductor elements by liquid refrigerant, and a housing for accommodating said semiconductor elements and said cooling structures, wherein a reactive gas is injected in one of the liquid refrigerant and said housing and wherein metal ions which react with said reactive gas to form a chemical compound hard to dissolve to said liquid refrigerant are injected in said liquid refrigerant.

8. The semiconductor module according to claim 7, wherein said metal ions comprises at least one of calcium, cobalt, iron, magnesium, nickel, lead and zinc ions.

9. A semiconductor module comprising semiconductor elements, and cooling structures for cooling said semiconductor elements by liquid refrigerant, wherein fine solid substances which are hard to dissolve to said liquid refrigerant and can move with the movement of the liquid refrigerant are included in said liquid refrigerant, whereby a pinhole which is formed in said cooling structures by corrosion is clogged by said solid substances.

10. An electronic computer comprising a plurality of semiconductor modules, each having semiconductor elements, cooling structures for cooling said semiconductor elements by liquid refrigerant, and a housing for accommodating said semiconductor elements and said cooling structures; a heat exchanger for cooling the liquid refrigerant; a circulating pump for forcedly circulating the liquid refrigerant; a purifying unit for purifying the liquid refrigerant; gas supply means for supplying into the refrigerant a reactive gas which reacts with ions of a metal constituting said cooling structures to form a chemical compound hard to dissolve to the liquid refrigerant; reactive gas detecting means for measuring a gas concentration in the liquid refrigerant; and control means for controlling, on the basis of measurement results by said reactive gas detecting means, said gas supply means to keep the reactive gas concentration in the liquid refrigerant at a constant level.

11. An electronic computer comprising a plurality of semiconductor modules, each having semiconductor elements, cooling structures for cooling said semiconductor elements by liquid refrigerant, and a housing for accommodating said semiconductor elements and said cooling structures; a heat exchanger for cooling the liquid refrigerant; a circulating pump for forcedly circulating the liquid refrigerant; a purifying unit for purifying the liquid refrigerant; gas supply means for supplying into each said housing a reactive gas which reacts with ions of a metal constituting said cooling structures to form a chemical compound hard to dissolve to the liquid refrigerant; gas detecting means for detecting the occurrence of a pinhole in each of said semiconductor modules; notifying means for notifying, on the basis of detection results by said gas detecting means, of a semiconductor module in which a pinhole has occurred; gas pressure measuring means for measuring the pressure of the reactive gas in each said housing; and control means for controlling, on the basis of measurement results by said gas pressure measuring means, said gas supply means to keep the gas pressure in each said housing higher by a predetermined value than the pressure of the liquid refrigerant.

* * * * *